United States Patent
Qiu et al.

(10) Patent No.: US 11,508,859 B2
(45) Date of Patent: Nov. 22, 2022

(54) METHOD FOR FORMING DOPED EPITAXIAL LAYER OF CONTACT IMAGE SENSOR

(71) Applicant: Shanghai Huali Microelectronics Corporation, Shanghai (CN)

(72) Inventors: Chenchen Qiu, Shanghai (CN); Jun Qian, Shanghai (CN); Chang Sun, Shanghai (CN); Zhengying Wei, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 221 days.

(21) Appl. No.: 17/142,431

(22) Filed: Jan. 6, 2021

(65) Prior Publication Data
US 2022/0069145 A1   Mar. 3, 2022

(30) Foreign Application Priority Data
Aug. 25, 2020 (CN) .......................... 202010861521.1

(51) Int. Cl.
*H01L 31/18* (2006.01)
*H01L 31/0352* (2006.01)
*H01L 27/146* (2006.01)

(52) U.S. Cl.
CPC ............. *H01L 31/035209* (2013.01); *H01L 27/14687* (2013.01); *H01L 31/18* (2013.01); *H01L 27/14649* (2013.01)

(58) Field of Classification Search
CPC ....... H01L 31/035209; H01L 27/14687; H01L 31/18; H01L 27/14649
See application file for complete search history.

(56) References Cited

U.S. PATENT DOCUMENTS

| | | | |
|---|---|---|---|
| 10,332,979 B2 * | 6/2019 | Li ...................... | H01L 21/0251 |
| 2021/0134797 A1 * | 5/2021 | Lin .................... | H01L 27/0886 |

* cited by examiner

*Primary Examiner* — Mounir S Amer
*Assistant Examiner* — Alexander Belousov
(74) *Attorney, Agent, or Firm* — Banner & Witcoff, Ltd.

(57) ABSTRACT

The disclosure discloses a method for forming a doped epitaxial layer of contact image sensor. Epitaxial growth is performed in times. After each time of epitaxial growth, trench isolation and ion implantation are performed to form deep and shallow trench isolation running through a large-thickness doped epitaxial layer. Through cyclic operation of epitaxial growth, trench isolation and ion implantation, the photoresist and hard mask required at each time do not need to be too thick. In the process of trench isolation and ion implantation, the photoresist and etching morphologies are good, such that the lag problem of the prepared contact image sensor is improved. By forming the large-thickness doped epitaxial layer by adopting the method for forming the doped epitaxial layer of the contact image sensor, a high-performance contact image sensor applicable to high quantum efficiency, small pixel size and near infrared/infrared can be prepared.

9 Claims, 1 Drawing Sheet

METHOD FOR FORMING DOPED EPITAXIAL LAYER OF CONTACT IMAGE SENSOR

CROSS-REFERENCE TO RELATED APPLICATIONS

This application claims priority to Chinese patent application No. CN 202010861521.1, filed on Aug. 25, 2020, and entitled "Method for Forming Doped Epitaxial Layer of Contact Image Sensor", the disclosure of which is incorporated herein by reference in its entirety.

TECHNICAL FIELD

The disclosure relates to a semiconductor technology and in particular to a method for forming a doped epitaxial layer of contact image sensor.

BACKGROUND

With the development of contact image sensor (CIS) towards near infrared/infrared (NIR/IR), quantum efficiency has become a key factor restricting the continuous improvement of the performance of the contact image sensor (CIS). At present, the common method is to thicken the epitaxy (Epi) of the raw material of the contact image sensor (CIS), increase the relative implantation depth of the contact image sensor (CIS), and deepen the isolation. However, implantation and etching deepening cause the required photoresist to become thick, such that the photolithography and dry etching morphologies are poor, which influences the implantation efficiency and the distribution of implanted ions in a silicon wafer, leading to the lag problem and restricting the improvement of quantum efficiency.

Referring to FIG. 1, an existing method for forming a doped epitaxial layer of an image sensor with high quantum efficiency (high QE) and applicable to near infrared/infrared (NIR/IR) includes the following steps:

In step 1, an epitaxial layer in one time is grown.

In step 2, deep trench isolation is formed. The isolation runs through the epitaxial layer of a silicon wafer, and thick photoresist or a thick hard mask is adopted for etching.

In step 3, ion implantation (IMP) is performed to the epitaxial layer with thickness required for a photodiode. In order to deepen the photodiode, thick photoresist needs to be used, and for small-line-width implantation, Double Exposure (DE) is respectively performed on the wafer covered by the photoresist, and a double pattern is adopted.

Since the photoresist (PR) and hard mask (HM) are thick, the existing method for forming the doped epitaxial layer of the image sensors often has the problem of poor morphology, leading to the lag problem, and restricting the improvement of quantum efficiency and performance of the image sensor (CIS).

Hard mask is a kind of inorganic thin film material formed through Chemical Vapor Deposition (CVD). Its main components usually include TiN, SiN, SiO2, etc.

BRIEF SUMMARY

The technical problem to be solved by the disclosure is to provide a method for forming a doped epitaxial layer of contact image sensor, which can ensure that in the process of trench isolation and ion implantation, the photoresist and etching morphologies are good, such that the lag problem of the prepared contact image sensor is improved.

In order to solve the above technical problem, the method for forming the doped epitaxial layer of contact image sensor provided by the disclosure includes the following steps:

step 1: performing first epitaxial growth on a wafer to form a first epitaxial layer;

step 2: forming first epitaxial trench isolation running through the first epitaxial layer on the first epitaxial layer;

step 3: performing first ion implantation to the epitaxial layer;

step 4: performing second epitaxial growth on the first epitaxial layer of the wafer to form a second epitaxial layer;

step 5: forming second epitaxial trench isolation in the second epitaxial layer, the second epitaxial trench isolation running through the second epitaxial layer and connected with the first epitaxial trench isolation;

step 6: performing second ion implantation to the epitaxial layer;

step 7: forming the doped epitaxial layer of the contact image sensor.

Preferably, after step 6, (1) third epitaxial growth is performed on the second epitaxial layer of the wafer to form a third epitaxial layer, (2) forming third epitaxial trench isolation in the third epitaxial layer, the third epitaxial trench isolation running through the third epitaxial layer and connected with the second epitaxial trench isolation, and (3) third ion implantation is performed to the epitaxial layer;

then step 7 is performed.

Preferably, after step 6, (1) third epitaxial growth is performed on the second epitaxial layer of the wafer to form a third epitaxial layer, (2) forming third epitaxial trench isolation in the third epitaxial layer, the third epitaxial trench isolation running through the third epitaxial layer and connected with the second epitaxial trench isolation, (3) third ion implantation is performed to the epitaxial layer, (4) fourth epitaxial growth is performed on the third epitaxial layer of the wafer to form a fourth epitaxial layer, (5) forming fourth epitaxial trench isolation in the fourth epitaxial layer, the fourth epitaxial trench isolation running through the fourth epitaxial layer and connected with the third epitaxial trench isolation, (6) fourth ion implantation is performed to the epitaxial layer;

then step 7 is performed.

Preferably, the thickness of the epitaxial layer grown at each time is smaller than 3.6 um.

Preferably, the dose of next ion implantation is greater than the dose of previous ion implantation.

Preferably, the energy of next ion implantation is greater than the energy of previous ion implantation.

Preferably, the dose of ion implantation at each time is within 1e12-5e13.

Preferably, the energy of ion implantation at each time is within 500 kev-2500 kev.

Preferably, the total thickness of the doped epitaxial layer of the contact image sensor formed in step 7 is greater than or equal to 5 um.

In the method for forming the doped epitaxial layer of contact image sensor provided by the disclosure, epitaxial growth is performed in times. After each time of epitaxial growth, trench isolation and ion implantation are performed to form deep and shallow trench isolation running through a large-thickness doped epitaxial layer (with thickness generally more than 7 um). Through cyclic operation of epitaxial growth, trench isolation and ion implantation, the photoresist and hard mask required at each time do not need to be too thick. In the process of trench isolation and ion implantation, the photoresist and etching morphologies are good, avoiding the situation that the morphologies are poor due to high depth-to-width ratio of deep trench isolation directly formed in the photolithography and etching process, such that the lag problem of the prepared contact image sensor (CIS) is improved. By forming the large-thickness doped epitaxial layer (with thickness generally more than 7 um) by adopting the method for forming the doped epitaxial layer of the contact image sensor, a high-performance contact image sensor (CIS) applicable to high quantum efficiency (QE), small pixel size (smaller than 1.0 um) and near infrared/infrared (NIR/IR) can be prepared.

BRIEF DESCRIPTION OF THE DRAWINGS

In order to more clearly describe the technical solution of the disclosure, the drawings which need be used in the disclosure will be briefly introduced below. Apparently, the drawings described below are just some embodiments of the disclosure. Those skilled in the art may obtain other drawings according to these drawings without contributing any inventive labor.

DETAILED DESCRIPTION OF THE DISCLOSURE

The technical solution of the disclosure will be described below clearly and completely with reference to the drawings. Apparently, the described embodiments are partial embodiments of the disclosure, instead of all embodiments. Based on the embodiments of the disclosure, all other embodiments obtained by those skilled in the art without contributing any inventive labor shall fall into the scope of protection of the disclosure.

Embodiment 1

Figure 1:
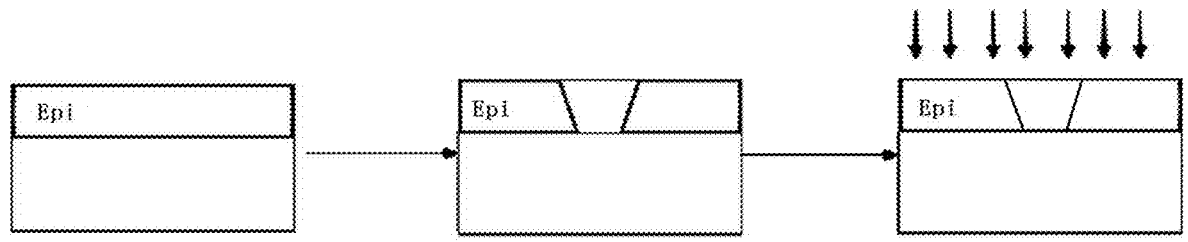
FIG. 1 is a schematic diagram of an existing method for forming a doped epitaxial layer of a contact image sensor.
Figure 2:
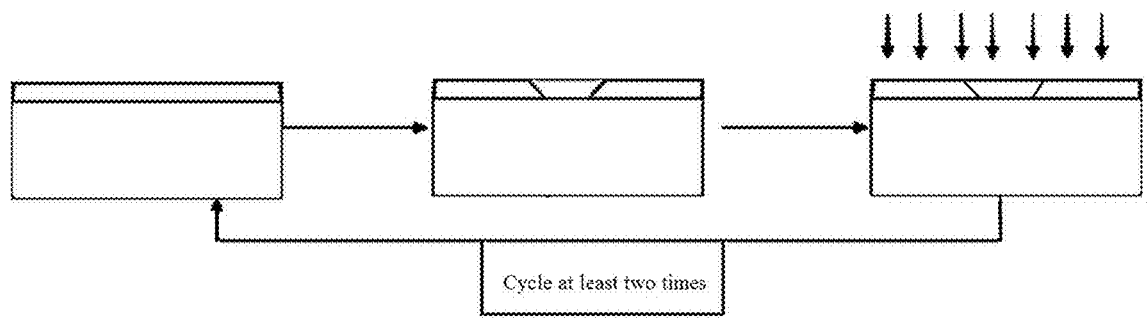
FIG. 2 is a schematic diagram of a method for forming a doped epitaxial layer of a contact image sensor according to one embodiment of the disclosure.

Referring to FIG. 2, a method for forming a doped epitaxial layer of contact image sensor includes the following steps:

step 1: performing first epitaxial growth on a wafer to form a first epitaxial layer;

step 2: forming first epitaxial trench isolation running through the first epitaxial layer on the first epitaxial layer;

step 3: performing first ion implantation to the epitaxial layer;

step 4: performing second epitaxial growth on the first epitaxial layer of the wafer to form a second epitaxial layer;

step 5: forming second epitaxial trench isolation in the second epitaxial layer, the second epitaxial trench isolation running through the second epitaxial layer and connected with the first epitaxial trench isolation;

step 6: performing second ion implantation to the epitaxial layer;

step 7: forming the doped epitaxial layer of the contact image sensor.

In the method for forming the doped epitaxial layer of contact image sensor provided by embodiment 1, epitaxial growth is performed in times. After each time of epitaxial growth, trench isolation and ion implantation are performed to form deep and shallow trench isolation running through a large-thickness doped epitaxial layer (with thickness generally more than 7 um). Through cyclic operation of epitaxial growth, trench isolation and ion implantation, the photoresist and hard mask required at each time do not need to be too thick. In the process of trench isolation and ion implantation, the photoresist and etching morphologies are good, avoiding the situation that the morphologies are poor due to high depth-to-width ratio of deep trench isolation directly formed in the photolithography and etching process, such that the lag problem of the prepared contact image sensor (CIS) is improved. By forming the large-thickness doped epitaxial layer (with thickness generally more than 7 um) by adopting the method for forming the doped epitaxial layer of the contact image sensor, a high-performance contact image sensor (CIS) applicable to high quantum efficiency (QE), small pixel size (smaller than 1.0 um) and near infrared/infrared (NIR/IR) can be prepared.

Embodiment 2

Based on the method for forming the doped epitaxial layer of contact image sensor provided by embodiment 1, after step 6, (1) third epitaxial growth is performed on the second epitaxial layer of the wafer to form a third epitaxial layer, (2) forming third epitaxial trench isolation in the third epitaxial layer, the third epitaxial trench isolation running through the third epitaxial layer and connected with the second epitaxial trench isolation, and (3) third ion implantation is performed to the epitaxial layer;

then step 7 is performed.

Embodiment 3

Based on the method for forming the doped epitaxial layer of contact image sensor provided by embodiment 1, after step 6, (1) third epitaxial growth is performed on the second epitaxial layer of the wafer to form a third epitaxial layer, (2) forming third epitaxial trench isolation in the third epitaxial layer, the third epitaxial trench isolation running through the third epitaxial layer and connected with the second epitaxial trench isolation, (3) third ion implantation is performed to the epitaxial layer, (4) fourth epitaxial growth is performed on the third epitaxial layer of the wafer to form a fourth epitaxial layer, (5) forming fourth epitaxial trench isolation in the fourth epitaxial layer, the fourth epitaxial trench isolation running through the fourth epitaxial layer and connected with the third epitaxial trench isolation, (6) fourth ion implantation is performed to the epitaxial layer;

then step 7 is performed.

Embodiment 4

Based on the method for forming the doped epitaxial layer of contact image sensor provided by embodiment 1 to embodiment 3, the thickness of the epitaxial layer grown at each time is smaller than 3.6 um.

Preferably, the dose of next ion implantation is greater than the dose of previous ion implantation.

Preferably, the energy of next ion implantation is greater than the energy of previous ion implantation.

Preferably, the dose of ion implantation at each time is within 1e12-5e13.

Preferably, the energy of ion implantation at each time is within 500 kev-2500 kev.

Preferably, the total thickness of the doped epitaxial layer of the contact image sensor formed in step 7 is greater than or equal to 5 um.

What are described above are just exemplary embodiments of the disclosure, which are not used to limit the disclosure. Any modification, equivalent replacement, improvement and the like made within the spirit and rule of the disclosure shall be included in the scope of protection of the disclosure.

What is claimed is:

1. A method for forming a doped epitaxial layer of a contact image sensor, wherein the method comprises the following steps:
- step 1: performing first epitaxial growth on a wafer to form a first epitaxial layer;
- step 2: forming first epitaxial trench isolation running through the first epitaxial layer on the first epitaxial layer;
- step 3: performing first ion implantation to the epitaxial layer;
- step 4: performing second epitaxial growth on the first epitaxial layer of the wafer to form a second epitaxial layer;
- step 5: forming second epitaxial trench isolation in the second epitaxial layer, the second epitaxial trench isolation running through the second epitaxial layer and connected with the first epitaxial trench isolation;
- step 6: performing second ion implantation to the epitaxial layer; and
- step 7: forming the doped epitaxial layer of the contact image sensor.

2. The method for forming the doped epitaxial layer of the contact image sensor according to claim 1, wherein
after step 6, (1) third epitaxial growth is performed on the second epitaxial layer of the wafer to form a third epitaxial layer, (2) forming third epitaxial trench isolation in the third epitaxial layer, the third epitaxial trench isolation running through the third epitaxial layer and connected with the second epitaxial trench isolation, and (3) third ion implantation is performed to the epitaxial layer;
then step 7 is performed.

3. The method for forming the doped epitaxial layer of the contact image sensor according to claim 1, wherein
after step 6, (1) third epitaxial growth is performed on the second epitaxial layer of the wafer to form a third epitaxial layer, (2) forming third epitaxial trench isolation in the third epitaxial layer, the third epitaxial trench isolation running through the third epitaxial layer and connected with the second epitaxial trench isolation, (3) third ion implantation is performed to the epitaxial layer, (4) fourth epitaxial growth is performed on the third epitaxial layer of the wafer to form a fourth epitaxial layer, (5) forming fourth epitaxial trench isolation in the fourth epitaxial layer, the fourth epitaxial trench isolation running through the fourth epitaxial layer and connected with the third epitaxial trench isolation, (6) fourth ion implantation is performed to the epitaxial layer;
then step 7 is performed.

4. The method for forming the doped epitaxial layer of the contact image sensor according to claim 1, wherein the thickness of the epitaxial layer grown at each time is smaller than 3.6 um.

5. The method for forming the doped epitaxial layer of the contact image sensor according to claim 1, wherein the dose of next ion implantation is greater than the dose of previous ion implantation.

6. The method for forming the doped epitaxial layer of the contact image sensor according to claim 1, wherein the energy of next ion implantation is greater than the energy of previous ion implantation.

7. The method for forming the doped epitaxial layer of the contact image sensor according to claim 1, wherein the dose of ion implantation at each time is within 1e12-5e13.

8. The method for forming the doped epitaxial layer of the contact image sensor according to claim 1, wherein the energy of ion implantation at each time is within 500 kev-2500 kev.

9. The method for forming the doped epitaxial layer of the contact image sensor according to claim 1, wherein the total thickness of the doped epitaxial layer of the contact image sensor formed in step 7 is greater than or equal to 5 um.

* * * * *